United States Patent [19]
Lee et al.

[11] Patent Number: 5,805,605
[45] Date of Patent: Sep. 8, 1998

[54] SEMICONDUCTOR INTEGRATED DEVICE

[75] Inventors: Cheol-Ha Lee; Myung-Ho Bae, both of Suwon, Rep. of Korea

[73] Assignee: Samsung Electronics Co., Ltd., Suwon, Rep. of Korea

[21] Appl. No.: 522,957

[22] Filed: Sep. 1, 1995

[30] Foreign Application Priority Data

Sep. 1, 1994 [KR] Rep. of Korea ................... 1994-22005

[51] Int. Cl.$^6$ .......................... G11C 29/00; G01R 31/28
[52] U.S. Cl. ........................ 371/21.1; 371/22.1; 370/241
[58] Field of Search ................. 371/21.1, 22.1, 371/22.2, 22.5, 22.6; 370/13, 33, 112, 241, 242, 244; 365/201

[56] References Cited

U.S. PATENT DOCUMENTS

| | | | |
|---|---|---|---|
| 4,044,244 | 8/1977 | Foreman et al. | 371/22.1 |
| 5,040,150 | 8/1991 | Naitoh et al. | 365/201 |
| 5,161,159 | 11/1992 | McClure et al. | 371/22.1 |
| 5,400,343 | 3/1995 | Crittenden et al. | 371/21.4 |

Primary Examiner—Robert W. Beausoliel, Jr.
Assistant Examiner—Trinh L. Tu
Attorney, Agent, or Firm—Cushman Darby & Cushman IP Group of Pillsbury Madison & Sutro LLP

[57] ABSTRACT

A semiconductor integrated device is disclosed which is capable of selectively executing a memory test and a logic test. The device includes a logic part for realizing a plurality of operation functions in logic, a memory part having a given integration and for storing data, a pad part including a pad for inputting/outputting a control signal according to respective tests, a switch part respectively connected to the logic part, the memory part, and the pad part, and a switch control part for controlling the switch part to thereby selectively control the memory test and the logic test. The semiconductor integrated device according to the present invention is capable of performing a separate logic test by dividing a memory fault and a logic fault on a memory testing path. The semiconductor integrated device has a memory signal path, a logic signal path, and a pad path which are selectively used. In this manner, the semiconductor integrated device enables division of a normal mode and a test mode, and also is capable of selectively testing a logic part and a memory part to thereby improve a quality of a chip embedding a memory. Furthermore, the semiconductor integrated device is capable of improving packaging efficiency without using a separate pin associated with memory control and data input/output.

6 Claims, 4 Drawing Sheets

SEMICONDUCTOR INTEGRATED DEVICE

BACKGROUND OF THE INVENTION

The present invention relates to a semiconductor integrated device, and more particularly to a semiconductor integrated device capable of selectively executing a logic test and a memory test.

There have been several attempts to form a high density of logic within one chip in order to realize a large scale system, but due to limitation of a memory bus they cannot be achieved. Because the bottle-neck of the memory bus cannot be alleviated by simply integrating many logic gates in one chip, a memory is embedded in the system to reduce the bottle-neck of the memory bus and a delay time of signal transmission, and also to cutdown on the production costs by reducing the board area.

An ASIC (Application Specific Integrated Circuit) can embed in an IC chip an exclusive circuit in order to reduce power consumption, and to improve reliability of the system, and be met with user's order. As the type of ASIC increase, users can embed standard ICs such as a memory device and a microprocessor.

However, as standard ICs have been embedded within the ASIC chips, a new problem is brought about on testing. Particularly, it is a new problem associated with RAM testing that a technique utilized in testing of random logic circuit cannot be directly utilized in RAM testing and so another new test technique is required. It is another problem associated with RAM testing that a RAM has much more various types of faults than the random logic circuit. For example, a pattern sensitivity fault exists in the RAM, but not in the random logic circuit.

One problem associated with testing of the RAM embedded inside the ASIC is what kind of test pattern is used and how to gain access to a RAM signal node. Another problem is associated with a fault range, requirement of an additional pin, and additional silicon area. Particularly, two methods are mainly used in testing the RAM embedded inside the ASIC. The first method is a PATT (Parallel Access Test Technique), and the second method is a BIST (Built-In Self Test).

These techniques are disclosed in detail in "IEEE, 1990 CUSTOM INTEGRATED CIRCUITS CONFERENCE, p 28.2.1–p 28.2.4".

FIG. 1 is a block diagram showing a conventional input signal port according to the parallel access test technique. FIG. 1 consists of an input macro connected through a pad, and a RAM to which an output OUT controlled by a control signal TEST is input. The control signal TEST enables the chip to be set to a test mode or a specific operation mode, and the input macro is chosen for a specific input voltage, for example TTL input level or CMOS input level, being required for specific signal.

FIG. 2 is a block diagram showing a conventional output signal port according to conventional parallel access test technique. In the same manner as in FIG. 1, the test signal TEST enables the chip to be set in the test mode or the specific operation mode. An output macro is chosen for a specific output current or impedance level, for example 4 mA, 8 mA or other required current value or 50 ohm, 75 ohm or other impedance value, being required for the specific signal.

FIG. 3 is a block diagram showing a conventional bi-directional signal port according to the parallel access test technique. In FIG. 3, two control signals in addition to the control signal TEST, i.e. read/write control signals R/$\overline{W}$, are used. The read/write control signals R/$\overline{W}$ enable the RAM to be set to read or write mode, an output enable signal OE enables an output buffer to be set to a tri-state mode.

The circuits shown in FIG. 1 to FIG. 3 are relatively constructed in a simple manner, but these circuits are embodied only for the RAM test. In case where the logic test is required, the logic test cannot be achieved with these circuit configurations. Also, in the state that a normal operation mode is executed, i.e. in the state that a signal is not input/output through the pad, and a logic path and a memory path are connected to each other, in the case where the input/output macros connected with the pad are not separated as in FIG. 1 to FIG. 3 and the input is floated, latch-up or electro-static discharge damages operation reliability of the chip.

SUMMARY OF THE INVENTION

It is therefore an object of the invention to provide a semiconductor integrated device capable of performing a separate logic test by dividing a memory fault and a logic fault on a memory testing path.

It is another object of the invention to provide a semiconductor integrated device where a memory signal path, a logic signal path, and a pad path selectively used are provided, thereby controlling the division of a normal mode and a test mode.

It is still another object of the invention to provide a semiconductor integrated device capable of selectively testing a logic part and a memory part, thereby improving a quality of a chip embedding a memory.

It is still yet another object of the invention to provide a semiconductor integrated device capable of improving efficiency of package without using a separate pin associated with memory control and data input/output.

In accordance with a first aspect of the present invention, a semiconductor integrated device capable of selectively executing a memory test and a logic test, includes: a logic part for realizing a plurality of operation functions in logic; a memory part having given integration and for storing data; a pad part comprising a pad for inputting/outputting control signals according to respective tests, a switch part connected to each of the logic part, the memory part and the pad part respectively; and a switch control part for selectively controlling the memory test and the logic test by controlling the switch part.

In accordance with a second aspect of the present invention, a semiconductor integrated device capable of selectively executing a memory test and a logic test includes: a logic part composed of a logic circuit for performing a plurality of operation functions in logic and a logic input/output interface circuit for determining a direction of an input/output signal depending on a logic state of an output enable signal supplied from the logic circuit; a memory part composed of a memory having a specific integration and for storing data and a memory input/output interface circuit for determining a direction of an input/output signal depending on a logic state of an output enable signal supplied from the memory; a pad part composed of a control circuit for inputting a signal controlling the logic test and the memory test, an input/output interface circuit determining a direction of input/output by controlling a control signal output from the control circuit, and a pad for inputting/outputting a signal according to respective tests; a switch part composed of first, second, and third switch circuits having one terminal commonly connected to each other and the other terminals being respectively connected to the logic input/output interface circuit, the memory input/output interface circuit and the input/output interface circuit; and a control part composed of a switch control decoder for determining a state of switching information depending on a signal state applied to a test pad for switching of the switch circuits respectively selected according to the test mode and a fourth switch circuit for preventing the input/output interface circuit within the pad part from being floated during a normal operation.

BRIEF DESCRIPTION OF THE DRAWINGS

The following is a detailed description of the invention by the reference of their attached drawings, in which like numbers indicate the same or similar element.

DETAILED DESCRIPTION OF THE PREFERRED EMBODIMENT

Figure 1:
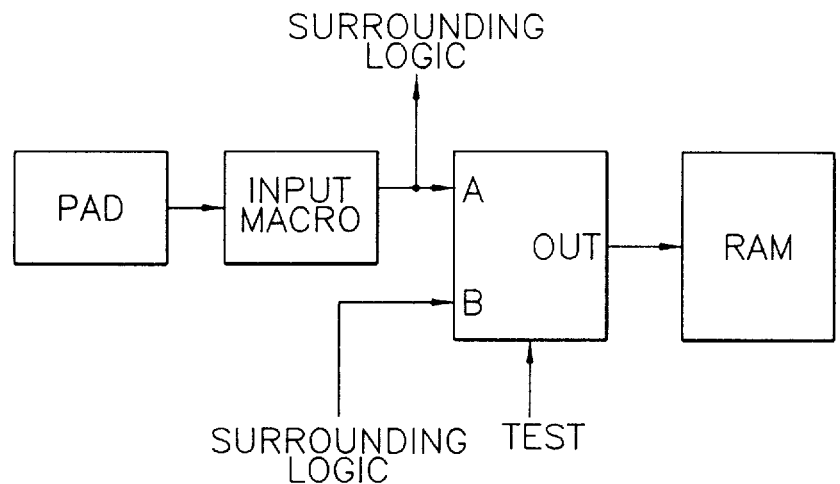
FIG. 1 is a block diagram illustrating a conventional input signal port.
Figure 2:
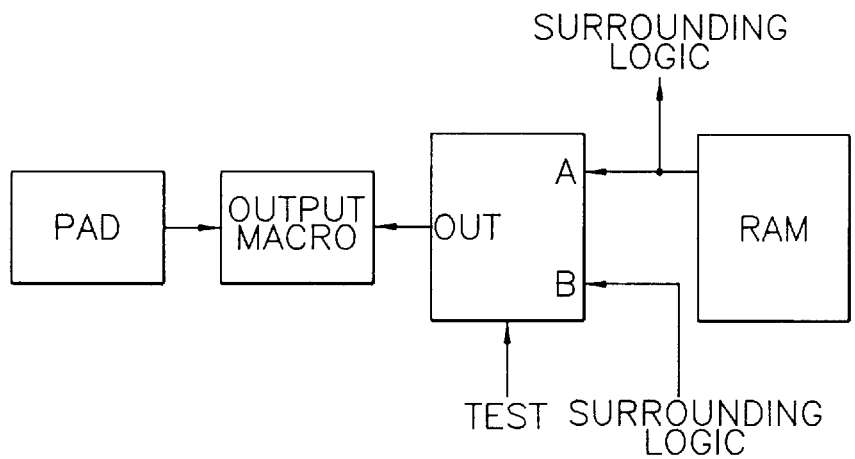
FIG. 2 is a block diagram illustrating a conventional output signal port.
Figure 3:
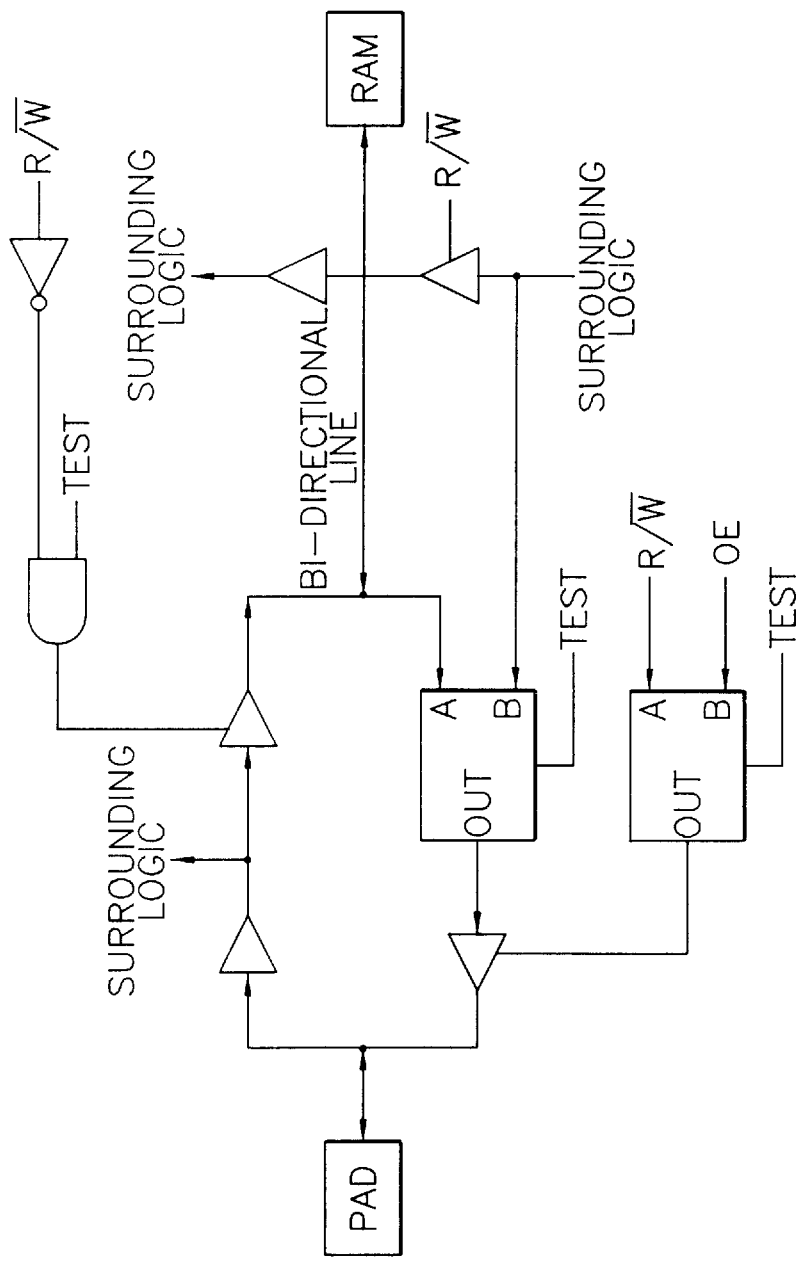
FIG. 3 is a block diagram illustrating a conventional bi-directional signal port.
Figure 4:
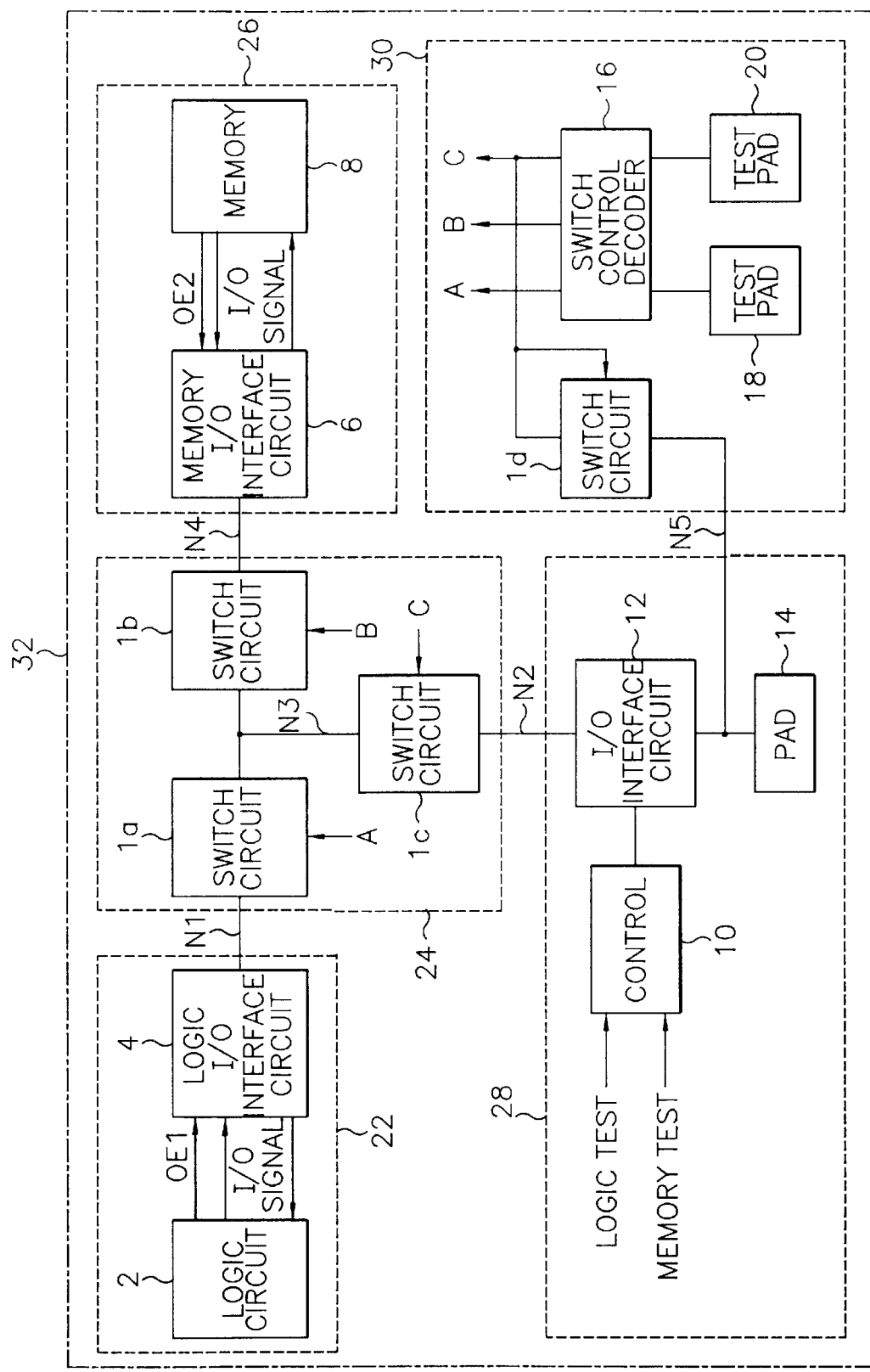
FIG. 4 is a schematic block diagram illustrating a semiconductor integrated device according to the invention.

FIG. 4 is a schematic block diagram illustrating a semiconductor integrated device according to the present invention. The semiconductor integrated device shown in FIG. 4 comprises a logic part 22 having a logic circuit 2 for realizing a plurality of operation functions, in which a system would be embodied, and a logic input/output interface circuit 4 for determining a direction of an input/output signal depending on a logic state of an output enable signal OE1 supplied from the logic circuit 2. A memory part 26 is provided which has a memory 8 having an integration for fully receiving desired functions of a system and for storing data, and a memory input/output interface circuit 6 for determining a direction of an input/output signal depending on a logic state of an output enable signal OE2 supplied from the memory 8. A pad part 28 is provided, which includes a control circuit 10 for inputting a signal controlling the logic test and the memory test, an input/output interface circuit 12 for determining a direction of an input/output signal by a control signal output from the control circuit 10, and a pad 14 for inputting/outputting a signal according to respective tests. A switch part 24 is provided, having switch circuits 1a,1b, and 1c, where the switch circuits 1a and 1c are enabled during the logic test, the switch circuits 1b and 1c are enabled during the memory test, and the switch circuits 1a and 1b are enabled during the normal operation to thereby cutoff a related path by the switch circuit disabled in respective test modes. A switch control part 30 is provided, having test pads 18 and 20 for switching information of the switch circuits 1a,1b, and 1c selected according to the test mode, a switch control decoder 16 for determining a state of decoding outputs A,B, and C depending on a signal state supplied to the test pads 18 and 20, and a switch circuit 1d for detecting a state of the decoding output C in order to prevent the input/output interface circuit 12 within the pad part 28 from being floated during the normal operation.

The semiconductor integrated device according to the present invention shown in FIG. 4 will be described in more detail. In the semiconductor integrated device shown in FIG. 4, the logic part 22 includes the logic circuit 2 for realizing in logic the plurality of desired operation functions of a system and the logic input/output interface circuit 4 for determining the direction of input/output signal depending on the logic state of the output enable signal OE1 supplied from the logic circuit 2. The logic input/output interface circuit 4 is connected with the switch circuit 1a within the switch part 24 through a node N1, and a signal on the node N1 is selectively used among an exclusive output signal, an exclusive input signal, and a bi-directional signal.

The memory part 26 includes the memory 8 having the integration for fully receiving desired functions of a system and for storing data, and the memory input/output interface circuit 6 for determining the direction of input/output signal depending on the logic state of the output enable signal OE2 supplied from the memory 8. The memory input/output interface circuit 6 is connected with the switch circuit 1b within the switch part 24 through a node N4, and a signal on the node N4 is selectively used among the exclusive output signal, the exclusive input signal, and the bi-directional signal.

The pad part 28 includes the control circuit 10 for inputting the signal controlling the logic test and the memory test, the input/output interface circuit 12 for determining the direction of input/output signal by the control signal output from the control circuit 10, and the pad 14 for inputting/outputting the signal . During the logic test the control circuit 10 logically ANDs switching information C of the switch circuit 1c, state information of the output enable signal OE1 outputted from the logic circuit 2, and the switching information A of the switch circuit 1a, to thereby determine the input/output direction of the input/output interface circuit 12. On the other hand, during the normal operation, the control circuit 10 inputs the switching information C of the switch circuit 1c to thereby disable the input/output interface circuit 12. In accordance with a determined state of the control circuit 10, the input/output interface circuit 12 inputs/outputs a signal between the pad 14 through a bi-directional node N2 connected to the switch circuit 1c which is enabled during the logic test and the memory test. The pad 14 can be used with the exclusive input signal, the exclusive output signal and the bi-directional signal for meeting the requirement of the logic test and the memory test, and input/outputs a signal in accordance with the direction of the input/output interface circuit 12 determined by the control circuit 10. In the pad part 28, because the pad 14 is NC(Non-connection)-treated during the normal operation and the switch circuit 1c is disabled, the input/output interface circuit 12 enables an output interface within the input/output interface circuit 12 to be in high impedance state by a control of switching information C of the switch circuit 1c. However, at this time, since an input interface is floated and the reliability of the device is accordingly reduced due to the floating of the gate, for preventing this reduction, input/output interface circuit 12 is supplied with a signal of logic "low" state that generated when the switch circuit 1c being disabled, through a node N5 between the pad 14 and the input/output interface circuit 12. As a result, gate floating can be prevented.

In the switch part 24, the switch circuit 1a determines whether or not a signal of the logic input/output interface circuit 4 is connected with a common node N3 through the node N1 in accordance with the logic state of the switching information A. The switch circuit 1b determines whether or not a signal of the memory input/output interface circuit 6 is connected with the common node N3 through the node N4 in accordance with the logic state of the switching information B. The switch circuit 1c determines whether or not a signal of the input/output interface circuit 12 is connected with the common node N3 through the node N2 according to the logic state of the switching information C.

An operation of the switch part 24 according to the test mode will be described hereinafter. First, during the logic test, by the switch control decoder 16 the switching information A and C are enabled to enable the switch circuits 1a and 1c and the switching information B is disabled to disable the switch circuit 1b, signal transmission between the logic input/output interface circuit 4 and the input/output interface circuit 12 can be possible.

Second, during the memory test, by the switch control decoder 16 the switching information B and C are enabled to enable the switch circuits 1b and 1c and the switching information A is disabled to disable the switch circuit 1a, signal transmission between the memory input/output interface circuit 6 and the input/output interface circuit 12 can be possible.

Third, during the normal operation, by the switch control circuit 16 the switching information A and B are enabled to enable the switch circuits 1a and 1b and the switching information C is disabled to disable the switch circuit 1c, signal transmission between the logic input/output interface circuit 4 and the memory input/output interface circuit 6 can be possible.

In the switch control part 30, the test pads 18 and 20 are provided as pads for an additional testing in order to obtain information as many as the number of switches controlled according to respective test modes, and if the test pads 18 and 20 are NC-treated without having an application of applying a specific voltage, they are operated in the normal operation. On the one hand, if a voltage in logic "high" state is input to the test pad 18 and a voltage in logic "low" state is input to the test pad 20, the pad 14 is established to be used as the path for the logic test and also used as the input/output path of the logic signal according to a using method. On the other hand, if a voltage of the logic "low" state is input to the test pad 18 and a voltage of the logic "high" state is input to the test pad 20, the pad 14 is established to be used as the path for the memory test.

The switch control decoder 16 is designed to carry out the normal operation, the logic test and the memory test according to a state of voltage input to the test pads 18 and 20.

A truth table according to the respective test modes is as follows;

| PAD 18 | PAD 20 | A | B | C | OPERATION |
|---|---|---|---|---|---|
| NC | NC | H | H | L | N |
| 1 | 0 | H | L | H | L |
| 0 | 1 | L | H | H | M | wherein, H and L refer to the switch enable state and the switch disable state respectively, and N, L and M refer to the normal operation, the logic test and the memory test, respectively. The description given on this table will be explained in more detail hereinafter.

First, if the test pads 18 and 20 are NC-treated, a specific electric potential is supplied, the outputs A and B of the switch control decoder 16 are enabled and the output C is disabled to thereby carry out the normal operation.

Second, if a voltage of the logic "high" state is applied to the test pad 18 and a voltage of the logic "low" state is applied to the test pad 20, the output A and C of the switch control decoder 16 are enabled and the output B is disabled to thereby carry out the logic test operation.

Third, if a voltage of the logic "low" state is applied to the test pad 18 and a voltage of the logic "high" state is applied to the test pad 20, the outputs B and C of the switch control decoder 16 are enabled and the output A is disabled to thereby carry out the memory test operation.

On the other hand, the switch circuit 1d is enabled in case where the output C is in the logic "low" state by the electric potential applied internally when the test pads 18 and 20 are NC-treated, the output C of the logic "low" state is supplied between the pad 14 and the input/output interface circuit 12 through the node N5, thereby preventing the input interface of the input/output interface circuit 12 from being floated.

Figure 5:
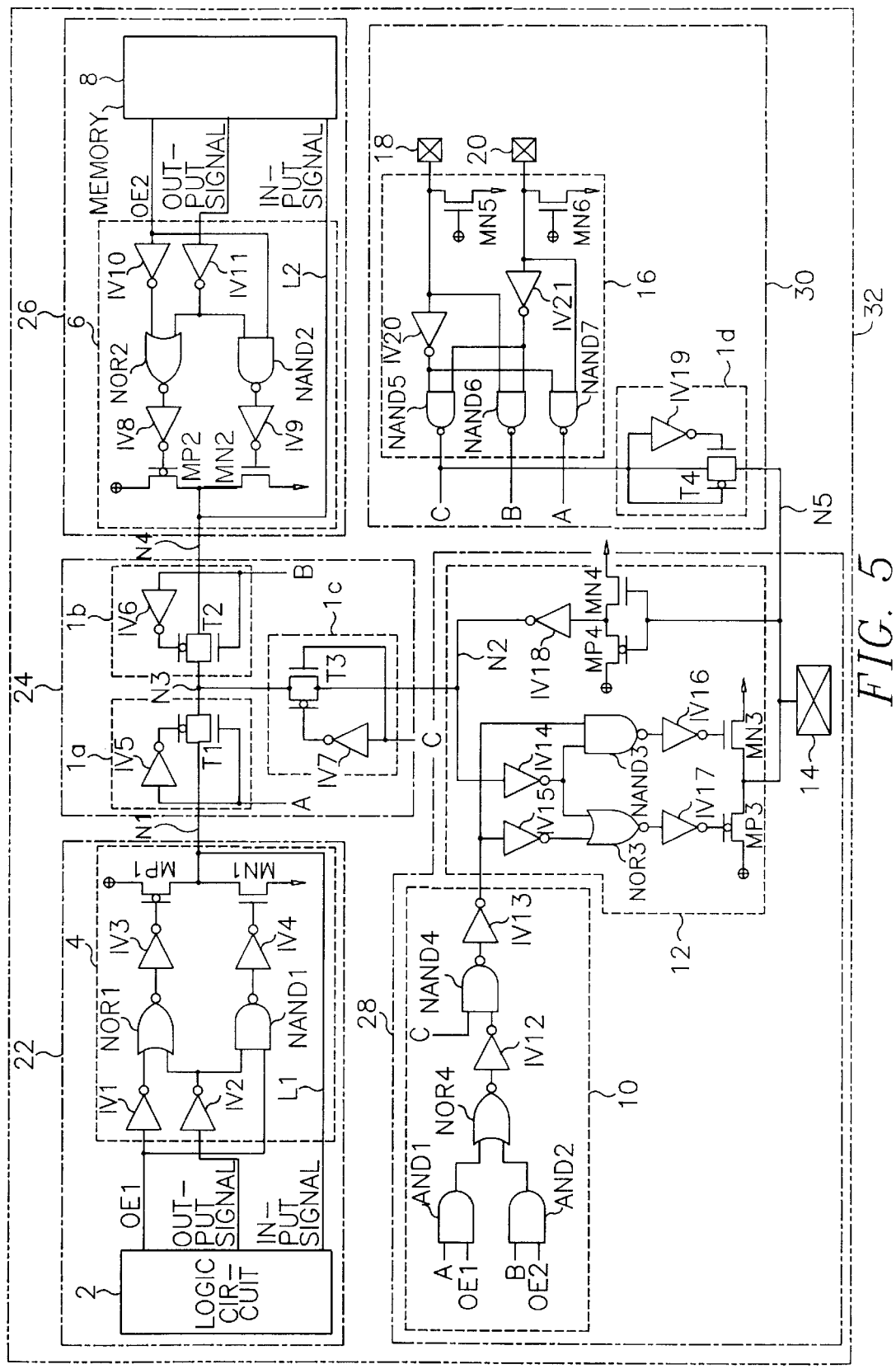
FIG. 5 is a detailed circuit diagram the semiconductor integrated device of FIG.4.

FIG. 5 is more detailed circuit of the semiconductor integrated device according to FIG. 4. The logic part 22 within the one chip 32 includes the logic circuit 2 and the logic input/output interface circuit 4. The output enable signal OE1 supplied from the logic circuit 2 is input to one input terminal of a NAND gate NAND1, and to one input terminal of a NOR gate NOR1 through an inverter IV1. An output signal supplied from the logic circuit 2 is input to the other input terminals of the NAND gate NAND1 and the NOR gate NOR1 through an inverter IV2. An output of the NOR gate NOR1 is input to a gate terminal of a P-MOS transistor MP1 through an inverter IV3, and an output of the NAND gate NAND1 is inputted to a gate terminal of a N-MOS transistor MN1 through an inverter IV4. At this time, a drain terminal of the P-MOS transistor MP1 and a source terminal of the N-MOS transistor MN1 are commonly connected to the node N1, and also there is provided a seperate line L1 for providing an input signal, which is supplied to the logic circuit 2 through the node N1. Under this configuration, when the output enable signal OE1 is in the logic "high" state the logic input/output interface circuit 4 becomes output interface, and when the output enable signal OE1 is in the logic "low" state the P-MOS transistor MP1 and the N-MOS transistor MN1 are turned off, thereby the logic input/output interface circuit 4 becomes input interface.

The memory part 26 includes the memory 8 and the input/output interface circuit 6. The output enable signal OE2 supplied from the memory 8 is input to one input terminal of a NAND gate NAND2 and to one input terminal of a NOR gate NOR2 through an inverter IV10. An output signal supplied from the memory 8 is input to the other input terminals of the NAND gate NAND2 and the NOR gate NOR2 through an inverter IV11. An output of the NOR gate NOR2 is input to a gate terminal of a P-MOS transistor MP2 through an inverter IV8, and an output of the NAND gate NAND2 is input to a gate terminal of an N-MOS transistor MN2 through an inverter IV9. At this time, a drain terminal of the P-MOS transistor MP2 and a source terminal of the N-MOS transistor MN2 are commonly connected to the node N4, and also there is provided a separate line L2 for providing an input signal which will be supplied to the memory 8 through the node N4.

The pad part 28 includes the control circuit 10, the input/output interface circuit 12, and the pad 14 for input/outputting a signal according to each test. The control circuit 10 has an AND gate AND1 to which the switching output A of the switch control circuit 16 and the output enable signal OE1 supplied from the logic circuit 2 are input, an AND gate AND2 to which the switching output B of the switch control decoder 16 and the output enable signal OE2 supplied from the memory 8 are input, a NOR gate NOR4 to which outputs of the AND gates AND1 and AND2 are input, a NAND gate NAND4 to which an output of the NOR gate NOR4 through an inverter IV12 and the switching output C output from the switch control decoder 16 are input, and an inverter IV13 which is connected to the input/output interface circuit 12 and to which an output of the NAND gate NAND4 is input.

In this control circuit 10, in order to perform a control operation corresponding to the respective test methods, in order to disable the switch 1c during the normal operation, if the switching output C of the outputs A,B and C of the switch control decoder 16 is disabled, an output of an inverter IV13 becomes in a logic "low" state by the output C which is one input source of the NAND gate NAND4, to thereby disable the output interface of the input/output interface circuit 12.

During the logic test, because the outputs A and C of the outputs A,B and C of the switch control decoder 16 are enabled, the output A and the output enable signal OE1 are input to the AND gate AND1 and in accordance with the input state, the operation direction of the input/output interface circuit 12 is selectively established.

During the memory test, because the outputs B and C of the outputs A,B and C of the switch control decoder 16 are enabled, the output B and the output enable signal OE2 are input to the AND gate AND2 and in accordance with the input state, the operation direction of the input/output interface circuit 12 is selectively established.

The input/output interface circuit 12 includes a NAND gate NAND3 to one input terminal of which the output enable signal supplied through the inverter IV13 of the control circuit 10 is input, a NOR gate NOR3 to one input terminal of which the output enable signal supplied through the inverter IV13 is input through an inverter IV15, an inverter IV14 which inputs an output signal input through the node N2 and supplies the output signal to the other input terminals of the NOR gate NOR3 and the NAND gate NAND3, an inverter IV17 which supplies an output of the NOR gate NOR3 to a gate terminal of a P-MOS transistor MP3, and an inverter IV16 which supplies an output of the NAND gate NAND3 to a gate terminal of an N-MOS transistor MN3. At this time, a source terminal of the N-MOS transistor MN3 and a drain terminal of the P-MOS transistor MP3 are commonly connected to the pad 14. And an input signal supplied to the pad 14 is connected to gate terminals of a P-MOS transistor MP4 and an N-MOS transistor MN4 respectively, and a drain terminal of the P-MOS transistor MP4 and a source terminal of the N-MOS transistor MN4 are commonly connected to be connected to the node N2 through an inverter IV18 to be thereby connected to the switch circuit 1c.

In case where the switching information C of the switch circuit 1c is disabled, the switch circuit 1c is disabled, the output interface of the interface circuit 12 is disabled, and the pad 14 according to the normal operation is in the NC state. In this case, for preventing the floating of the input interface of the input/output interface circuit 12 only in case the switching information C is disabled the switch circuit 1d is enabled by connecting to the node N5 between the pad 14 and the input/output interface circuit 12 to be enabled, in order to set the input interface state to the logic "low" state.

The switch part 24 is composed of the switch circuits 1a, 1b, and 1c. In the switch circuit 1a, the switching information A output from the switch control decoder 16 is connected to an N-MOS gate of a transmission transistor T1 and to a P-MOS gate of the transmission transistor T1 through an inverter IV5. In case where the switching information A is in the logic "high" state, the switch circuit 1a is turned on so that the logic input/output interface circuit 4 and the common node N3 are connected to each other. Also, in case where the switching information A is in the logic "low" state, the switch circuit 1a is turned off so that the connection of the input/output interface circuit 4 and the common node N3 is cut off.

In the switch circuit 1b, the switching information B output from the switch control decoder 16 is connected to an N-MOS gate of a transmission transistor T2, and to a P-MOS gate of the transmission transistor T2 through an inverter IV6. In case where the switching information B is in the logic "high" state, the switch circuit 1b is turned on so that the memory input/output interface circuit 6 and the common node N3 are connected to each other. Also, in case where the switching information B is in the logic "low" state, the switch circuit 1b is turned off so that the connection of the memory input/output interface circuit 6 and the common node N3 is cut off.

In the switch circuit 1c, the switching information C output from the switch control decoder 16 is connected to an N-MOS gate of the transmission transistor T3, and to a P-MOS gate of the transmission transistor T3 through an inverter IV7. In case where the switching information C is in the logic "high" state, the switch circuit 1c is turned on so that the input/output interface circuit 12 and the common node N3 are connected to each other. Also, in case where the switching information C is in the logic "low" state, the switch circuit 1c is turned off so that the connection of the input/output interface circuit 12 and the common node N3 is cut off.

The switch control part 30 includes the switch control decoder 16, the switch circuit 1d and the test pads 18 and 20. In the switch control decoder 16, a power applied to the test pad 18 is supplied to one input terminal of a NAND gate NAND6, and to respective one input terminals of NAND gates NAND5 and NAND7 through an inverter IV20. Also, a power applied to the test pad 20 is supplied to the other input terminal of the NAND gate NAND7, and to the other input terminals of the NAND gates NAND5 and NAND6 through an inverter IV21.

Further, there are provided an N-MOS transistor MN5 where a drain terminal is connected to an input line of the test pad 18, where a gate terminal is connected to a power supply voltage Vcc, and where a source terminal is connected to a ground voltage Vss, and an N-MOS transistor MN6 where a drain terminal is connected to an input line of the test pad 20, where a gate terminal is connected to a power supply voltage Vcc, and where a source terminal is connected to a ground voltage Vss. The N-MOS transistors MN5 and MN6 are used during the normal operation to control a size ratio of the transistor in order to increase turn-on resistance, when the test pads 18 and 20 are NC-treated, so that an electric potential of the logic "low" state is supplied to disable the switching information C in the switching information A, B, and C. In case where a voltage of the logic "high" state is applied to the test pad 18 and a voltage of the logic "low" state to the test pad 20, the N-MOS transistors MN5 and MN6 disable the switching information B in the switching information A, B, and C to cut off a memory path, thereby being operated in the logic test mode.

In the meanwhile in case where the voltage of the logic "low" state is applied to the test pad 18 and the voltage of the logic "high" state to the test pad 20, the N-MOS transistors MN5 and MN6 disable the switching information A in the switching information A, B, and C to cut off a logic path, thereby being operated in the memory test mode.

In the switch circuit 1d, the switching information C of the switch control part 30 is connected to a P-MOS gate of a transmission transistor T4 and to an N-MOS gate of the transmission gate T4 through an inverter IV19 so that the switching information C is in the logic "high" state, the switch circuit 1d is turned off. On the other hand, in case where the switching information C is in the logic "low" state, the switch circuit 1d is turned on so that the switching information C is supplied to an input terminal of the input/output interface circuit 12, thereby preventing the switch circuit 1d from being floated during the normal operation.

While there have been illustrated and described what are considered to be preferred embodiments of the present invention, it will be understood by those skilled in the art that various changes and modifications may be made, and equivalents may be substituted for elements thereof without departing from the true scope of the present invention.

The semiconductor integrated device according to the present invention is capable of performing an additional logic test by separating a memory fault and a logic fault on a memory testing path. And also the semiconductor integrated device where a memory signal path, a logic signal path, and a pad path selectively used are provided, thereby controlling the division of a normal mode and a test mode. And the semiconductor integrated device is capable of selectively testing a logic part and a memory part, thereby improving a quality of a chip embedding a memory. And the semiconductor integrated device is capable of improving efficiency of package without using a separate pin associated with memory control and data input/output.

What's claimed is:

1. A semiconductor integrated device capable of selectively executing a memory test and a logic test, said device comprising:

a logic part for realizing a plurality of operation functions in logic, wherein said logic part comprises a logic circuit for realizing said operation functions in logic, and a logic input/output interface circuit for determining a direction of a input/output signal depending on an output enable signal supplied from said logic circuit;

a memory part having a memory of given integration for storing data, and a memory input/output interface circuit for determining a direction of an input/output signal depending on an output enable signal supplied from said memory;

a pad part comprising a pad for inputting/outputting control signals according to respective tests, wherein said pad part further comprises a control circuit for generating an output enable signal according to a selected test mode, and an input/output interface circuit for determining a direction of an input/output signal depending on said output enable signal outputted from said control circuit;

a switch part connected to a each of said logic part, said memory part, and said pad part, wherein said switch part comprises first, second, and third switch circuits, each of said switch circuits having a first terminal and a second terminal, each of said first terminals being commonly connected to each other, and said second terminals being respectively connected to said logic part, said memory part, and said pad part, wherein said first switch circuit and said third switch circuit are enabled during said logic test, said second switch circuit and said third switch circuit are enabled during said memory test, and said first switch circuit and said second switch circuit are enabled during normal operation, so that said switch part cuts off a related path by any one of said first, second, and third switch circuits disabled in said respective test modes; and a switch control part for selectively controlling said memory test and said logic test by controlling said switch part.

2. The semiconductor integrated device as claimed in claim 1, wherein said switching control part comprises a test pad for obtaining switching information of said first, said second, and said third switch circuits according to respective test modes, a switching control decoder for outputting the switching information according to an input state of said test pad, and a fourth switch circuit for preventing said input/output interface circuit within said pad part from being floated during said normal operation.

3. A semiconductor integrated device capable of selectively executing a memory test and a logic test, said device comprising:

a logic part composed of a logic circuit for realizing a plurality of operation functions in logic and a logic input/output interface circuit for determining a direction of an input/output signal depending on a logic state of an output enable signal supplied from said logic circuit;

a memory part comprising a memory having given integration and for storing data and a memory input/output interface circuit for determining a direction of input/output signal depending on a logic state of an output enable signal supplied from said memory;

a pad part comprising a control circuit for inputting a signal controlling a logic test and a memory test, an input/output interface circuit for determining a direction of input/output signal by controlling a control signal output from said control circuit, and a pad for inputting/outputting a signal according to respective tests;

a switch part comprising first, second, and third switch circuits, each of said switch circuits having a first terminal and a second terminal, each of said first terminals being commonly connected to each other, and said second terminals being respectively connected to said logic input/output interface circuit, said memory input/output interface circuit, and said input/output interface circuit; and a switch control part comprising a switch control decoder for determining a state of switching information depending on a signal state applied to a test pad for switching of said switch circuits respectively selected according to said test modes, and a fourth switch circuit for preventing said input/output interface circuit within said pad part from being floated during a normal operation.

4. The semiconductor integrated device as claimed in claim 3, wherein said first and third switch circuits are enabled and said second switch circuit is disabled during said logic test, so that signal transmission between said logic input/output interface circuit and said input/output interface circuit can be possible.

5. The semiconductor integrated device as claimed in claim 4, wherein said second and third switch circuits are enabled and said first switch circuit is disabled during said memory test, so that signal transmission between said memory input/output interface circuit and said input/output interface circuit can be possible.

6. The semiconductor integrated device as claimed in claim 5, wherein said first and second switch circuits are enabled and said third switch circuit is disabled during said normal operation, so that signal transmission between said logic input/output interface circuit and said memory input/output interface circuit can be possible.

* * * * *